(12) United States Patent
Chen

(10) Patent No.: US 7,922,053 B2
(45) Date of Patent: Apr. 12, 2011

(54) FEEDER FOR A SURFACE MOUNT PLACEMENT SYSTEM

(75) Inventor: Yi-Xin Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 353 days.

(21) Appl. No.: 12/185,105

(22) Filed: Aug. 3, 2008

(65) Prior Publication Data

US 2009/0232573 A1    Sep. 17, 2009

(30) Foreign Application Priority Data

Mar. 12, 2008  (CN) .......................... 2008 1 0300536

(51) Int. Cl.
*B65H 20/00* (2006.01)
*B23P 21/00* (2006.01)

(52) U.S. Cl. ............ 226/128; 226/32; 226/139; 29/806; 414/416.01

(58) Field of Classification Search .................. 226/128, 226/129, 139, 32; 29/806, 740, 739, 759; 414/416.01
See application file for complete search history.

(56) References Cited

U.S. PATENT DOCUMENTS

| 4,887,778 | A | * | 12/1989 | Soth et al. | ...................... 226/109 |
| 5,725,140 | A | * | 3/1998 | Weber et al. | .................. 226/139 |
| 5,839,637 | A | * | 11/1998 | Kanai | ............................ 226/128 |
| 6,032,845 | A | * | 3/2000 | Piccone et al. | ................. 226/139 |
| 6,474,527 | B2 | * | 11/2002 | Miller | ............................. 226/32 |
| 6,631,868 | B2 | * | 10/2003 | Miller et al. | .................. 242/563 |
| 7,448,130 | B2 | * | 11/2008 | Choi et al. | ....................... 29/806 |
| 2002/0108984 | A1 | * | 8/2002 | Miller | ............................. 226/32 |

* cited by examiner

*Primary Examiner* — Evan H Langdon
(74) *Attorney, Agent, or Firm* — Frank R. Niranjan

(57) ABSTRACT

A feeder for a surface mount placement system includes a feeder body comprising a shaft, a front cover, and a rear cover. The front cover has one end pivotally installed on the feeder body via the shaft, a free end, and a pair of sidewalls respectively extending from two sides of the free end towards the feeder body. The rear cover pivotally installed on the feeder body, including a blocking portion, and the free end of the front cover overlap. The blocking portion is wider than the distance between the sidewalls of the front cover.

2 Claims, 1 Drawing Sheet

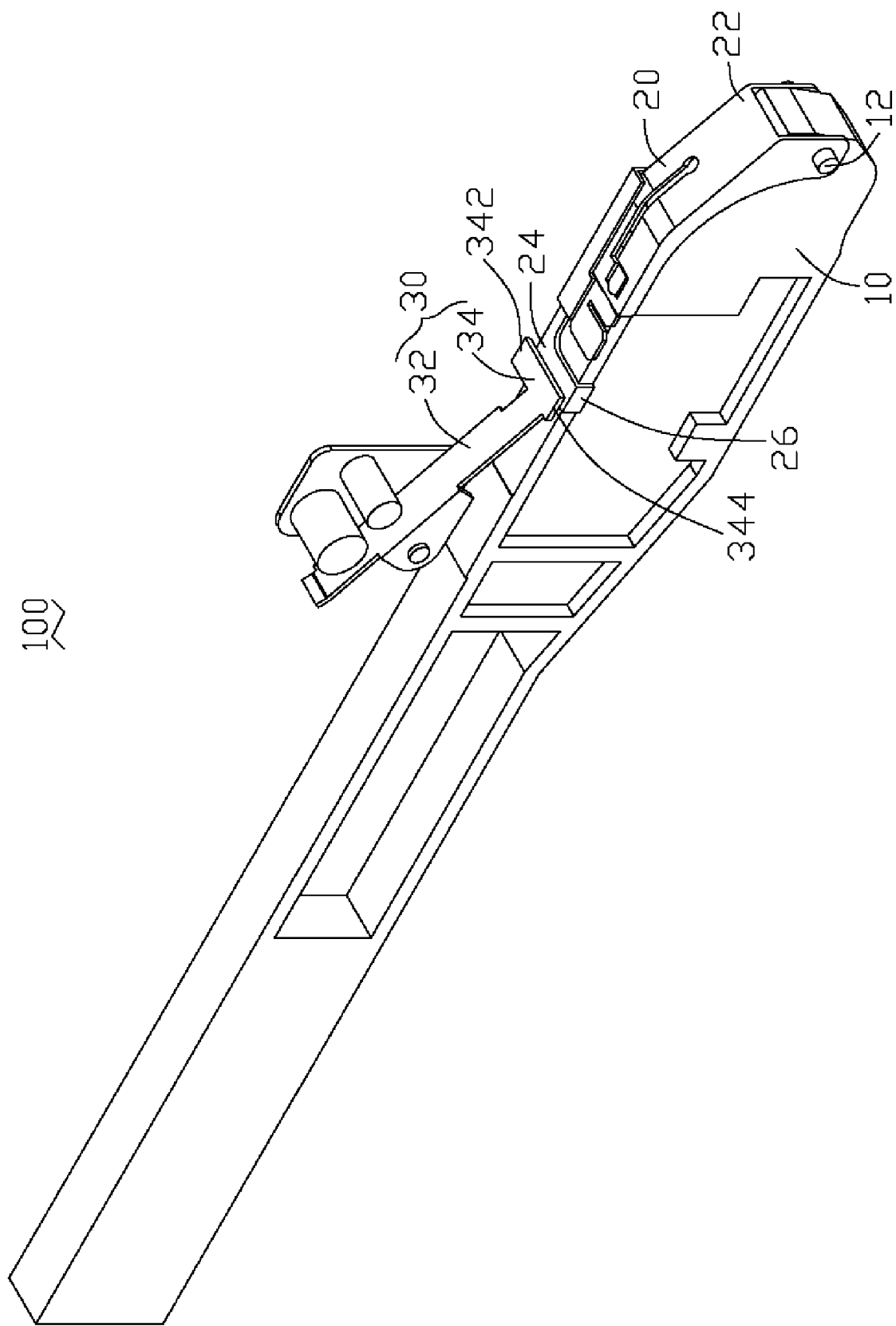

FEEDER FOR A SURFACE MOUNT PLACEMENT SYSTEM

BACKGROUND

1. Field of the Invention

The present invention relates to surface mount placement systems, and specifically to a feeder for a surface mount placement system.

2. Description of Related Art

An exemplary feeder for a surface mount placement system manufactured by SONY Corporation comprises a feeder body, a front cover, and a rear cover. A shaft is disposed on a front end of the feeder body. The front cover is pivotally installed on the feeder body via the shaft used to contact and guide a strip. The front cover comprises a first end close to the shaft, a second end away from the shaft, and a pair of sidewalls. The sidewalls extend from the second end towards the feeder body. The rear cover is pivotally installed on a rear end of the feeder body, such that a free end of the rear cover and the second end of the front cover overlap.

When the strip is fed, the front cover is placed upon the feeder body, pressing down on the rear cover, and as a result, the free end of the rear cover presses down on the second end of the front cover. As such, the rear cover has enough force to firmly press the front cover and the strip during the manufacturing process. A problem, though, is that the width of the free end of the rear cover is less than the distance between the sidewalls of the front cover. When the rear cover is mistakenly pressed down before the front cover, the feeder body and the free end of the rear cover. No pressure is placed upon the front cover to firmly press the feeder body, thereby allowing the front cover to rattle during the manufacturing process.

Therefore, a heretofore unaddressed need exists in the industry to address the described limitations.

SUMMARY

According to an exemplary embodiment of the present invention, a feeder for a surface mount placement system includes a feeder body comprising a shaft, a front cover, and a rear cover. The front cover has one end pivotally installed on the feeder body via the shaft, a free end, and a pair of sidewalls respectively extending from two sides of the free end towards the feeder body. The rear cover pivotally installed on the feeder body comprises a blocking portion that interferes with the free end of the front cover. The blocking portion is wider than the distance between the sidewalls of the front cover.

Other advantages and novel features will become more apparent from the following detailed description when taken in conjunction with the accompanying drawing, in which:

BRIEF DESCRIPTION OF THE DRAWING

The drawing is an assembly sketch view of a feeder for a surface mount placement system in accordance with an exemplary embodiment;

DETAILED DESCRIPTION OF THE EMBODIMENTS

Referring to the drawing, a feeder 100 for a surface mount placement system comprises a feeder body 10, a front cover 20, and a rear cover 30. A shaft 12 is disposed on a front end of the feeder body 10. The front cover 20 is pivotally installed on the feeder body 10 via the shaft 12 used to press and guide the strip (not shown), the front cover 20 comprises a front end 22 close to the shaft 12, a free end 24 away from the shaft 12, and a pair of sidewalls 26. The sidewalls 26 perpendicular to the free end 24 respectively extend from two sides of the free end 24 towards the feeder body 10. The rear cover 30 is pivotally installed on a rear end of the feeder body 10, the rear cover 30 comprises a body 32 and a blocking portion 34 disposed on one end of the body 32, such that the blocking portion 34 and the free end 24 of the front cover 20 overlap, and the blocking portion 34 comprises two opposite sides 342 and 344. The distance between the two sides 342, 344, like the width of the block 34, exceeds the distance between the sidewalls 26 of the front cover 20. In this embodiment, the rear cover 30 is L-shaped.

When a strip is fed, the front cover 20 moves onto the feeder body 10 before pressing down on the rear cover 30. The blocking portion 34 of the rear cover 30 then presses down on the free end 24 of the front cover 20. As such, the rear cover 30 receives enough force to firmly press the front cover 20 and the strip (not shown) during the manufacturing process.

When the rear cover 30 is mistakenly pressed down first, the front cover 20 cannot be covered on the feeder body 10 by the blocking of the blocking portion 34 because of the width of the blocking portion 34 exceeds the distance between the sidewalls 26 of the free end 24. The feeder 100 can thus prevent such operating problems.

While exemplary embodiments have been described above, it should be understood that they have been presented by way of example only and not by way of limitation. Thus, the breadth and scope of the present invention should not be limited by the above-described exemplary embodiments, but should be defined only in accordance with the following claims and their equivalents.

What is claimed is:

1. A feeder for a surface mount placement system, comprising:
    a feeder body, one end thereof comprising a shaft;
    a front cover comprising one end pivotally installed on the feeder body via the shaft, a free end, and a pair of sidewalls respectively extending from two sides of the free end towards the feeder body;
    a rear cover pivotally installed on the feeder body, comprising a blocking portion, overlapping the free end of the front cover;
    wherein the blocking portion is wider than the distance between the sidewalls of the front cover.

2. The feeder as claimed in claim 1, wherein the rear cover is L-shaped.

* * * * *